(12) United States Patent
Wu et al.

(10) Patent No.: US 11,411,134 B2
(45) Date of Patent: Aug. 9, 2022

(54) LIGHT EMITTING APPARATUS, METHOD OF FABRICATING LIGHT EMITTING APPARATUS, AND METHOD OF EMITTING LIGHT USING LIGHT EMITTING APPARATUS THEREOF

(71) Applicants: BEIJING BOE DISPLAY TECHNOLOGY CO., LTD., Beijing (CN); BOE Technology Group Co., Ltd., Beijing (CN)

(72) Inventors: Chenchen Wu, Beijing (CN); Xiaona Liu, Beijing (CN); Yuqiong Chen, Beijing (CN); Mengjie Wang, Beijing (CN); Shuai Yuan, Beijing (CN); Ziyi Zheng, Beijing (CN); Rui Zhang, Beijing (CN); Yujia Sun, Beijing (CN)

(73) Assignees: BEIJING DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 302 days.

(21) Appl. No.: 16/626,563

(22) PCT Filed: May 29, 2019

(86) PCT No.: PCT/CN2019/089021
§ 371 (c)(1),
(2) Date: Dec. 25, 2019

(87) PCT Pub. No.: WO2020/151151
PCT Pub. Date: Jul. 30, 2020

(65) Prior Publication Data
US 2021/0408326 A1  Dec. 30, 2021

(30) Foreign Application Priority Data
Jan. 25, 2019  (CN) .......................... 201910074093.5

(51) Int. Cl.
*H01L 33/10* (2010.01)
*H01L 33/00* (2010.01)
(Continued)

(52) U.S. Cl.
CPC ............ *H01L 33/10* (2013.01); *H01L 33/005* (2013.01); *H01L 33/04* (2013.01); *H01L 33/12* (2013.01)

(58) Field of Classification Search
CPC ....... H01L 33/10; H01L 33/005; H01L 33/04; H01L 33/12; H01L 25/0756; H01L 27/15; H01L 33/54; H01L 33/60
See application file for complete search history.

(56) References Cited

U.S. PATENT DOCUMENTS 7,413,326 B2 * 8/2008 Tain .................... F21V 29/74
362/294
8,226,264 B1 * 7/2012 Morejon .................. F21V 9/32
362/231
(Continued)

FOREIGN PATENT DOCUMENTS

CN   101257081 A   9/2008
CN   201887046 U   6/2011
(Continued)

OTHER PUBLICATIONS

International Search Report & Written Opinion dated Oct. 25, 2019, regarding PCT/CN2019/089021.
(Continued)

*Primary Examiner* — Matthew G Landau
*Assistant Examiner* — Dmitriy Yemelyanov
(74) *Attorney, Agent, or Firm* — Intellectual Valley Law, P.C.

(57) ABSTRACT

A light emitting apparatus is provided. The light emitting apparatus includes a frame structure having a bottom side
(Continued)

and a reflective lateral side connecting to the bottom side; and a first light emitting element and a second light emitting element on the bottom side of the frame structure. The first light emitting element is configured to emit a first light having a first wavelength range along a first direction. The second light emitting element is configured to emit a second light having a second wavelength range along a second direction. The first direction and the second direction are substantially opposite to each other. The reflective lateral side of the frame structure is configured to reflect the first light having the first wavelength range into a first reflected light and reflect the second light having the second wavelength range into a second reflected light.

14 Claims, 6 Drawing Sheets

(51) Int. Cl.
  *H01L 33/04* (2010.01)
  *H01L 33/12* (2010.01)

(56) References Cited

U.S. PATENT DOCUMENTS

2008/0149949 A1* 6/2008 Nakamura ............ H01L 33/22
  257/89
2010/0189981 A1* 7/2010 Poblenz ............ C30B 29/406
  428/220
2014/0339580 A1 11/2014 Nasa

FOREIGN PATENT DOCUMENTS

| CN | 104157762 A | 11/2014 |
| CN | 106353923 A | 1/2017 |
| CN | 106876544 A | 6/2017 |
| CN | 107256917 A | 10/2017 |
| CN | 107481999 A | 12/2017 |
| CN | 207967040 U | 10/2018 |
| KR | 20030066955 A | 8/2003 |
| WO | 02052615 A2 | 7/2002 |

OTHER PUBLICATIONS

First Office Action in the Chinese Patent Application No. 201910074093.5, dated Nov. 4, 2019; English translation attached.
V. Patil et al., Photon Recycling Semiconductor LED, https://www.researchgate.net/publication/280824535, Conference Paper, Apr. 2009.
Second Office Action in the Chinese Patent Application No. 201910074093.5, dated Feb. 3, 2020; English translation attached.

* cited by examiner

LIGHT EMITTING APPARATUS, METHOD OF FABRICATING LIGHT EMITTING APPARATUS, AND METHOD OF EMITTING LIGHT USING LIGHT EMITTING APPARATUS THEREOF

CROSS-REFERENCE TO RELATED APPLICATION

This application is a national stage application under 35 U.S.C. § 371 of International Application No. PCT/CN2019/089021, filed May 29, 2019, which claims priority to Chinese Patent Application No. 201910074093.5, filed Jan. 25, 2019. Each of the forgoing applications is herein incorporated by reference in its entirety for all purposes.

TECHNICAL FIELD

The present invention relates to display technology, more particularly, to a light emitting apparatus, a method of fabricating a light emitting apparatus, and a method of emitting light using a light emitting apparatus.

BACKGROUND

The light emitting diodes (LEDs) have lots of advantages including simple structure, small size, energy efficiency, extended life, durability, and directional emissions. The LEDs have gradually replaced traditional light bulbs and fluorescent lamps. Also, the LEDs are widely used in photovoltaic systems.

SUMMARY

In one aspect, the present invention provides a light emitting apparatus, comprising a frame structure having a bottom side and a reflective lateral side connecting to the bottom side; and a first light emitting element and a second light emitting element on the bottom side of the frame structure; wherein the first light emitting element is configured to emit a first light having a first wavelength range along a first direction substantially parallel to a main surface of the bottom side of the frame structure; the second light emitting element is configured to emit a second light having a second wavelength range along a second direction substantially parallel to the main surface of the bottom side of the frame structure, wherein the first direction and the second direction are substantially opposite to each other; and the reflective lateral side of the frame structure is configured to reflect the first light having the first wavelength range into a first reflected light and reflect the second light having the second wavelength range into a second reflected light, wherein the first reflected light and the second reflected light transmit out of a substantially transparent top side of the light emitting apparatus in form of a composite light comprising a first component of the first wavelength range and a second component of the second wavelength range, wherein the substantially transparent top side is opposite to the bottom side.

Optionally, the light emitting apparatus further comprises a base substrate between the first light emitting element and the second light emitting element; wherein the first light emitting element, the base substrate, and the second light emitting element are sequentially arranged along a direction substantially parallel to the main surface of the bottom side; the first light emitting element and the second light emitting element are respectively on a first side and a second side of the base substrate, wherein the first side and the second side are two substantially opposite sides of the base substrate, and the first side and the second side are respectively substantially perpendicular to the main surface of the bottom side; and orthographic projections of the first light emitting element and the second light emitting element on a plane containing the first side of the base substrate are substantially non-overlapping with an orthographic projection of the bottom side on the plane containing the first side of the base substrate.

Optionally, the base substrate is a growth substrate for epitaxial growth of layers of the first light emitting element and layers of the second light emitting element.

Optionally, the first light emitting element comprises a first quantum-well layer on the first side of the base substrate configured to emit the first light having the first wavelength range toward the reflective lateral side of the frame structure; the second light emitting element comprises a second quantum-well layer on the second side of the base substrate configured to emit the second light having the second wavelength range toward the reflective lateral side of the frame structure; the first light having the first wavelength range transmits from the first quantum-well layer to the reflective lateral side without transmitting through the second quantum-well layer; the second light having the second wavelength range transmits from the second quantum-well layer to the reflective lateral side without transmitting through the first quantum-well layer; and the first quantum-well layer, the base substrate, and the second quantum-well layer are sequentially arranged along a direction substantially parallel to the main surface of the bottom side.

Optionally, the light emitting apparatus further comprises a first reflective layer between the base substrate and the first quantum-well layer, and configured to reflect light emitted from the first quantum-well layer toward the reflective lateral side of the frame structure; and a second reflective layer between the base substrate and the second quantum-well layer, and configured to reflect light emitted from the second quantum-well layer toward the reflective lateral side of the frame structure; and the first quantum-well layer, the first reflective layer, the base substrate, the second reflective layer, and the second quantum-well layer are sequentially arranged along the direction substantially parallel to the main surface of the bottom side.

Optionally, the first reflective layer is a distributed Bragg reflector; and the second reflective layer is a distributed Bragg reflector.

Optionally, the first light emitting element further comprises a first type doped semiconductor layer on a side of the first quantum-well layer closer to the base substrate; and a second type doped semiconductor layer on a side of the first quantum-well layer away from the base substrate; wherein the second light emitting element further comprises a third type doped semiconductor layer on a side of the second quantum-well layer closer to the base substrate; and a fourth type doped semiconductor layer on a side of the second quantum-well layer away from the base substrate; wherein the second type doped semiconductor layer, the first quantum-well layer, the first type doped semiconductor layer, the first reflective layer, the base substrate, the second reflective layer, the third type doped semiconductor layer, the second quantum-well layer, and the fourth type doped semiconductor layer are sequentially arranged along the direction substantially parallel to the main surface of the bottom side.

Optionally, the first light emitting element further comprises a first electrode on a side of the first type doped semiconductor layer away from the base substrate; and a second electrode on a side of the second type doped semiconductor layer away from the base substrate; wherein an orthographic projection of the first electrode on the base substrate is substantially non-overlapping with an orthographic projection of the first quantum-well layer on the base substrate; and an orthographic projection of the second electrode on the base substrate at least partially overlaps with the orthographic projection of the first quantum-well layer on the base substrate.

Optionally, the second light emitting element further comprises a third electrode on a side of the third type doped semiconductor layer away from the base substrate; and a fourth electrode on a side of the fourth type doped semiconductor layer away from the base substrate; wherein an orthographic projection of the third electrode on the base substrate is substantially non-overlapping with an orthographic projection of the second quantum-well layer on the base substrate; and an orthographic projection of the fourth electrode on the base substrate at least partially overlaps with the orthographic projection of the second quantum-well layer on the base substrate.

Optionally, the composite light is a light of white color.

Optionally, the light emitting apparatus further comprises a first buffer layer between the base substrate and the first reflective layer; and a second buffer layer between the base substrate and the second reflective layer.

Optionally, a vertical cross-section of the frame structure along a plane perpendicular to the bottom side of the frame structure and containing a geometric center of the bottom side has a substantially inverted trapezoidal shape having an opening on a side away from the bottom side.

Optionally, the lateral side of the substantially inverted trapezoidal shape are curved lines.

Optionally, the light emitting apparatus is absent of any wavelength conversion layer.

Optionally, the substantially transparent top side of the light emitting apparatus has an arch shape protruding along a direction opposite to the bottom side of the frame structure.

Optionally, the bottom side of the frame structure has a rectangular shape or a trapezoidal shape.

In another aspect, the present invention provides a method of fabricating a light emitting apparatus, comprising forming a frame structure having a bottom side and a reflective lateral side connecting to the bottom side; forming a first light emitting element and a second light emitting element on the bottom side of the frame structure; wherein the first light emitting element is formed to emit a first light having a first wavelength range along a first direction substantially parallel to a main surface of the bottom side of the frame structure; the second light emitting element is formed to emit a second light having a second wavelength range along a second direction substantially parallel to the main surface of the bottom side of the frame structure, wherein the first direction and the second direction are substantially opposite to each other; and the reflective lateral side of the frame structure is formed to reflect the first light having the first wavelength range into a first reflected light and reflect the second light having the second wavelength range into a second reflected light, wherein the first reflected light and the second reflected light transmit out of a substantially transparent top side of the light emitting apparatus in form of a composite light comprising a first component of the first wavelength range and a second component of the second wavelength range, wherein the substantially transparent top side is opposite to the bottom side Optionally, forming the first light emitting element and the second light emitting element on the bottom side of the frame structure comprises providing a growth substrate; forming a first reflective layer on a first side of the growth substrate; forming a first type doped semiconductor layer on a side of the first reflective layer away from the growth substrate; forming a first quantum-well layer on a side of the first type doped semiconductor layer away from the growth substrate; forming a second type doped semiconductor layer on a side of the first quantum-well layer away from the growth substrate; forming a second reflective layer on a second side of the growth substrate, the first side and the second side are two substantially opposite sides of the growth substrate; forming a third type doped semiconductor layer on a side of the second reflective layer away from the growth substrate; forming a second quantum-well layer on a side of the third type doped semiconductor layer away from the growth substrate; forming a fourth type doped semiconductor layer on a side of the second quantum-well layer away from the growth substrate; wherein the second type doped semiconductor layer, the first quantum-well layer, the first type doped semiconductor layer, the first reflective layer, the base substrate, the second reflective layer, the third type doped semiconductor layer, the second quantum-well layer, and the fourth type doped semiconductor layer are sequentially arranged along the direction substantially parallel to the main surface of the bottom side.

In another aspect, the present invention provides a method of emitting light using a light emitting apparatus, comprising emitting a first light having a first wavelength range along a first direction substantially parallel to a main surface of a bottom side of a frame structure using a first light emitting element on the bottom side of the frame structure; emitting a second light having a second wavelength range along a second direction substantially parallel to the main surface of the bottom side of the frame structure using a second light emitting element on the bottom side of the frame structure; reflecting the first light having the first wavelength range into a first reflected light and reflect the second light having the second wavelength range into a second reflected light using a reflective lateral side of the frame structure; and transmitting the first reflected light and the second reflected light out of a substantially transparent top side of the light emitting apparatus in form of a composite light comprising a first component of the first wavelength range and a second component of the second wavelength range; wherein the first direction and the second direction are substantially opposite to each other; the reflective lateral side of the frame structure is connected to the bottom side of the frame structure; and the substantially transparent top side of the light emitting apparatus is opposite to the bottom side of the frame structure.

Optionally, the first light emitting element comprises the first quantum-well layer on the first side of the base substrate; and the second light emitting element comprises a second quantum-well layer on the second side of the base substrate. The method further comprises emitting the first light having the first wavelength range toward the reflective lateral side of the frame structure using the first quantum-well layer; and emitting the second light having the second wavelength range toward the reflective lateral side of the frame structure using the second quantum-well layer; wherein the first light having the first wavelength range transmits from the first quantum-well layer to the reflective lateral side without transmitting through the second quantum-well layer; and the second light having the second wavelength range transmits from the second quantum-well layer to the reflective lateral side without transmitting through the first quantum-well layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
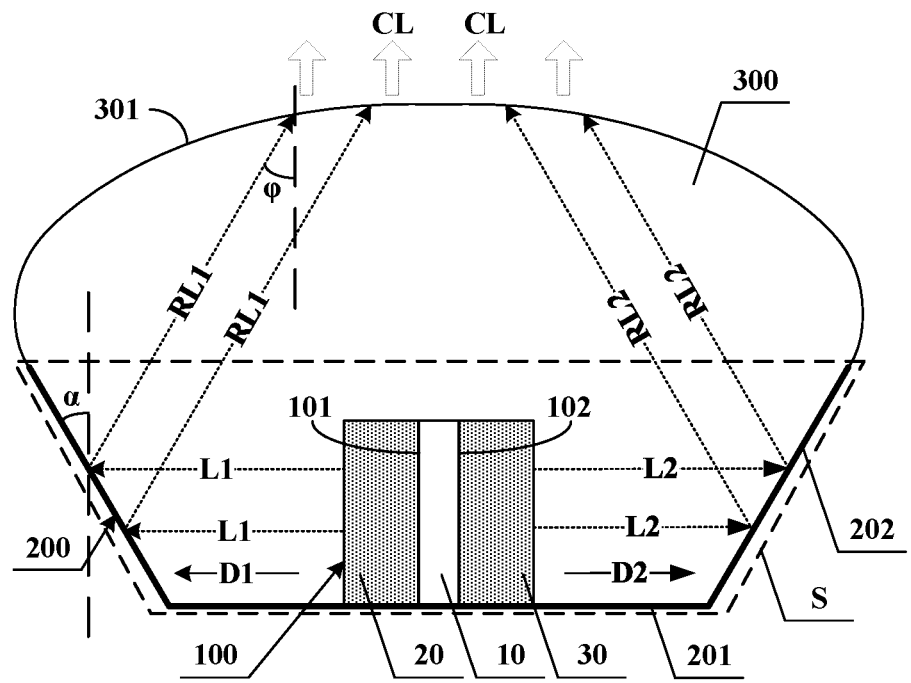
FIG. 1A is a schematic diagram of a structure of a light emitting apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

There are many types of methods to emit white light using LEDs. A first type method includes using blue light emitted from LEDs to cause fluorescent materials to emit yellow light, so, the blue light and the yellow light combine together and become white light, and using ultraviolet light emitting from LEDs to cause fluorescent materials to emit red light, blue light, and green light, so, the red light, blue light, and green light combine together and become white light.

A second type method includes using multiple LEDs respectively on multiple substrates, for example, the multiple LEDs can emit red light, green light, and blue light, which will combine and become white light.

The first type method results in a low light conversion efficiency. The second type method requires complicated circuit designs, and the apparatus formed using the second type method has a relatively bigger size and has difficulties in cooling.

Due to the disadvantages of the first type method and the second type method, a third type method is attracting more and more attentions. The third type method is using LEDs sharing a same substrate to emit white light, which is also called "dual-wavelength LEDs".

A dual-wavelength LED has two quantum-well layers emitting two light of two different wavelengths, respectively. One way for the dual-wavelength LED to emit white light is to alternatively emit the two light of two different wavelengths, using the visual staying phenomenon to let human eye to see substantially white light. Another way for a dual-wavelength LED to emit white light is to let the two quantum-well layers to emit the two light of two different wavelengths at the same time, the two light of two different wavelengths combine together into white light. Another way for dual-wavelength LED to emit white light is to use a quantum-well layer emitting blue light and a quantum-well layer emitting yellow light. The quantum-well layer emitting blue light emits blue light first, and the blue light causes the quantum-well layer emitting yellow light to emit yellow light, the blue light emitted from the quantum-well layer emitting blue light and the yellow light emitted from the quantum-well layer emitting yellow light combine together and become white light. However, the third type method results in a low light output efficiency.

Accordingly, the present disclosure provides, inter alia, a light emitting apparatus, a method of fabricating a light emitting apparatus, and a method of emitting light using a light emitting apparatus that substantially obviate one or more of the problems due to limitations and disadvantages of the related art. In one aspect, the present disclosure provides a light emitting apparatus. In some embodiments, the light emitting apparatus includes a frame structure having a bottom side and a reflective lateral side connecting to the bottom side; and a first light emitting element and a second light emitting element on the bottom side of the frame structure. Optionally, the first light emitting element is configured to emit a first light having a first wavelength range along a first direction substantially parallel to a main surface of the bottom side of the frame structure. Optionally, the second light emitting element is configured to emit a second light having a second wavelength range along a second direction substantially parallel to the main surface of the bottom side of the frame structure. Optionally, the first direction and the second direction are substantially opposite to each other. Optionally, the reflective lateral side of the frame structure is configured to reflect the first light having the first wavelength range into a first reflected light and reflect the second light having the second wavelength range into a second reflected light. Optionally, the first reflected light and the second reflected light transmit out of a substantially transparent top side of the light emitting apparatus in form of a composite light including a first component of the first wavelength range and a second component of the second wavelength range. Optionally, the substantially transparent top side is opposite to the bottom side.

It is discovered in the present disclosure that the reason leading to the low light output efficiency for outputting white light is that the two quantum-well layers emitting the two light of two different wavelengths are disposed on a same side of a same base substrate. The two light of two different wavelengths have a same emission direction, resulting that light emitted from one of the two quantum-well layers transmits through another one of the two quantum-well layers and inevitably affects the another one of the two quantum-well layers, and further resulting in interference between the two light of two different wavelengths. For example, one of the two quantum-well layers is a quantum-well layer emitting blue light, and another one of the two quantum-well layers is a quantum-well layer emitting yellow light. According to Planck's law E=hv, blue light has a shorter wavelength and yellow light has a longer wavelength, so, the blue light has a higher energy and the yellow light has a lower energy. Energy of a blue photon is higher than a band gap width Eg of the quantum-well layer emitting yellow light. When the blue light transmits through the quantum-well layer emitting yellow light, blue photons are absorbed, and the energy of the blue photons is released by radiation transition or non-radiation transition. So, a light emitting apparatus having two quantum-well layers disposed on a same side of a same base substrate will have a relatively low quantum efficiency which results in the low light output efficiency.

In some embodiments, the present disclosure provides a light emitting apparatus having a first light emitting element and a second light emitting element respectively on two opposite sides of a base substrate. Optionally, the first light emitting element emits a first light having a first wavelength range in a first direction, and the second light emitting element emits a second light having a second wavelength range in a second direction. Optionally, there is no mutual interference between the first light having the first wavelength range and the second light having the second wavelength range. This arrangement will enhance the quantum efficiency and improve the quality of the white color, so the light emitting apparatus has advantages including a high light output efficiency and a great color rendering index.

FIG. 1A is a schematic diagram of a structure of a light emitting apparatus in some embodiments according to the present disclosure. Referring to FIG. 1A, in some embodiments, the light emitting apparatus includes a light emitting structure 100, a frame structure 200, and a substantially transparent layer 300 having a substantially transparent top side 301.

As used herein, the term "substantially transparent" means at least 50 percent (e.g., at least 60 percent, at least 70 percent, at least 80 percent, at least 90 percent, and at least 95 percent) of an incident light transmitted therethrough. For example, at least 50 percent of light emitted from the light emitting structure 100 transmitted through the substantially transparent layer 300.

In some embodiments, the frame structure 200 includes a bottom side 201 and a reflective lateral side 202 connecting to the bottom side 201. Optionally, the reflective lateral side 202 has a ring shape. Optionally, the bottom side 201 and the reflective lateral side 202 defines a space S. Optionally, the space S has a truncated cone shape.

Various shapes may be adopted by the bottom side 201 of the frame structure. Examples of shapes suitable for the bottom side 201 include, but are not limited to, a circular shape, an oval shape, a rectangular shape, and a polygonal shape.

Optionally, a vertical cross-section of the frame structure 200 along a plane perpendicular to the bottom side 201 and containing a geometric center of the bottom side 201 has a substantially inverted trapezoidal shape having an opening on a side away from the bottom side 201.

As used herein, "substantially trapezoidal shape" or "substantially inverted trapezoidal shape" can include shapes or geometries having at least one pair of substantially parallel sides (regardless of whether the other two sides include straight lines, curved lines or otherwise). As used herein, the term "substantially parallel sides" refers to two sides forming an included angle in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, or approximately 10 degrees to approximately 15 degrees. Optionally, the at least one pair of substantially parallel sides of the substantially trapezoidal shape includes a shorter side and a longer side, wherein the longer side is closer to the bottom side of the frame structure. Optionally, the at least one pair of substantially parallel sides of the substantially inverted trapezoidal shape includes a shorter side and a longer side, wherein the shorter side is closer to the bottom side of the frame structure.

Optionally, the lateral sides of the substantially inverted trapezoidal shape are curved lines. Optionally, the lateral sides of the substantially inverted trapezoidal shape are folded lines.

In some embodiment, the light emitting structure 100 includes a first light emitting element 20 and a second light emitting element 30 on the bottom side 201 of the frame structure 200. Optionally, the light emitting structure 100 is disposed on the bottom side 201 of the frame structure 200.

In some embodiments, the light emitting structure 100 includes a base substrate 10 between the first light emitting element 20 and the second light emitting element 30. Optionally, the first light emitting element 20, the base substrate 10, and the second light emitting element 30 are sequentially arranged along a direction substantially parallel to the main surface of the bottom side 201.

As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees, or approximately 0 degree. For example, an angle between the direction along which the first light emitting element 20, the base substrate 10, and the second light emitting element 30 are sequentially arranged and the main surface of the bottom side 201 is in the range of 0 degree to approximately 45 degrees.

Optionally, the base substrate 10 is a growth substrate for epitaxial growth of layers of the first light emitting element 20 and layers of the second light emitting element 20.

In some embodiments, the first light emitting element 20 and the second light emitting element 30 are respectively on a first side 101 and a second side 102 of the base substrate 10. In one example, the first light emitting element 20 is on the first side 101 of the base substrate 10. In another example, the second light emitting element 30 is on the second side of the base substrate 10.

Optionally, the first side 101 and the second side 102 are two substantially opposite sides of the base substrate 10. Optionally, the first side 101 and the second side 102 are respectively substantially perpendicular to the main surface of the bottom side 201.

As used herein, the term "substantially perpendicular" means that an angle is in the range of approximately 45 degrees to approximately 135 degrees, e.g., approximately 85 degrees to approximately 95 degrees, approximately 80 degrees to approximately 100 degrees, approximately 75 degrees to approximately 105 degrees, approximately 70 degrees to approximately 110 degrees, approximately 65 degrees to approximately 115 degrees, approximately 60 degrees to approximately 120 degrees, or approximately 90 degrees. For example, an angle between the first side 101 and the main surface of the bottom side 201 is in the range of approximately 45 degrees to approximately 135 degrees.

As used herein, the term "substantially opposite sides" means two sides of an object that are substantially parallel to each other, and facing away from each other.

Optionally, orthographic projections of the first light emitting element 20 and the second light emitting element 30 on the base substrate 10 at least partially overlap with each other.

Optionally, orthographic projections of the first light emitting element 20 and the second light emitting element 30 on a plane containing the first side 101 of the base substrate 10 are substantially non-overlapping with an orthographic projection of the bottom side 201 on the plane containing the first side 101 of the base substrate 10.

As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. For example, the orthographic projections of the first light emitting element 20 on a plane containing the first side 101 of the base substrate 10 and the orthographic projection of the bottom side 201 on the plane containing the first side 101 of the base substrate 10 are at least 50 percent non-overlapping.

Optionally, the orthographic projections of the first light emitting elements 20 and the second light emitting elements 30 on the plane containing the first side 101 of the base substrate 10 are at least partially overlapping with an orthographic projection of the reflective lateral side 202 on the plane containing the first side 101 of the base substrate 10.

Various appropriate light emitting elements may be used in the light emitting apparatus. Examples of appropriate light emitting elements include, but are not limited to, organic light emitting diodes, quantum dots light emitting diodes, and micro light emitting diodes.

In some embodiments, the first light emitting element 20 is configured to emit a first light L1 having a first wavelength range along a first direction D1 substantially parallel to a main surface of the bottom side 201 of the frame structure 200. Optionally, the second light emitting element 30 is configured to emit a second light L2 having a second wavelength range along a second direction D2 substantially parallel to the main surface of the bottom side 201 of the frame structure 200. Optionally, the first direction D1 and the second direction D2 are substantially opposite to each other.

As used herein, the term "substantially opposite" in the context of direction means that an included angle between two direction is in the range of approximately 135 degrees to approximately 225 degrees, e.g., approximately 170 degrees to approximately 190 degrees, approximately 160 degrees to approximately 200 degrees; approximately 150 degrees to approximately 210 degrees; approximately 140 degrees to approximately 220 degrees, approximately 135 degrees to approximately 225 degrees, or approximately 180 degrees. For example, an angle between the first direction D1 and the second direction D2 is in the range of approximately 135 degrees to approximately 225 degrees.

Optionally, the first direction D1 is toward the reflective lateral side 202 of the frame structure 200. For example, the first light L1 having the first wavelength range along the first direction D1 is toward the reflective lateral side 202 of the frame structure 200.

Optionally, the second direction D2 is toward the reflective lateral side 202 of the frame structure 200. For example, the second light L2 having the second wavelength range along the second direction D2 is toward the reflective lateral side 202 of the frame structure 200.

In some embodiments, the reflective lateral side 202 of the frame structure 200 is configured to reflect the first light L1 having the first wavelength range into a first reflected light RL1 and reflect the second light L2 having the second wavelength range into a second reflected light RL2. Optionally, the first reflected light RL1 and the second reflected light RL2 transmit out of the substantially transparent top side 301 of the light emitting apparatus in form of a composite light CL including a first component of the first wavelength range and a second component of the second wavelength range. Optionally, the substantially transparent top side 301 is opposite to the bottom side 201 of the frame structure 200.

Optionally, the bottom side 201 of the frame structure 200 is a reflective bottom side configured to reflect the first light L1 having the first wavelength range and the second light L2 having the second wavelength range.

Optionally, an acute angle $\alpha$ is between the reflective lateral side 202 of the frame structure 200 and a direction perpendicular to the bottom side 201 of the frame structure 200. an acute angle $\varphi$ is between the reflected light (e.g. the first reflected light or the second reflected light) and the direction perpendicular to the bottom side 201 of the frame structure 200. Optionally, the acute angle $\alpha$ is in a range of approximately 10° to approximately 40°, e.g., approximately 10° to approximately 20°, approximately 20° to approximately 30°, and approximately 30° to approximately 40°. So, the acute angle $\varphi$ is in a range of approximately 10° to approximately 70°, e.g. approximately 10° to approximately 30°; approximately 30° to approximately 50°, and approximately 50° to approximately 70°

In some embodiments, the space S defined by the bottom side 201 and the reflective lateral side 202 is filled with the substantially transparent layer 300. Optionally, the substantially transparent layer 300 protrudes along a direction away from the bottom side 201 of the frame structure 200, to form a cupcake shape light emitting apparatus.

Optionally, the substantially transparent layer 300 is configured to composite the first reflected light RL1 and the second reflected light RL2 into the composite light CL including the first component of the first wavelength range and the second component of the second wavelength range. Optionally, the substantially transparent top side 301 of the substantially transparent layer 300 is configured to allow the composite light CL to transmit therethrough.

Optionally, the substantially transparent layer 300 has an arch shape protruding along a direction opposite to the bottom side 201 of the frame structure 200. Optionally, the substantially transparent top side 301 has an arch shape protruding along a direction opposite to the bottom side 201 of the frame structure 200. For example, a cross-section of the substantially transparent top side 301 has an inverted u-shape.

Optionally, a cross-section of the substantially transparent layer 300 on a plane parallel to the bottom side 201 of the frame structure 200 has a circular shape, an oval shape, a rectangular shape, or a polygonal shape. Optionally, a cross-section of the substantially transparent top side 301 on a plane parallel to the bottom side 201 of the frame structure 200 has a circular shape, an oval shape, a rectangular shape, or a polygonal shape.

In some embodiments, the first light emitting element 20 has a top-emitting structure, and a top side of the first light emitting element 20 is away from the base substrate 10. Optionally, the second light emitting element 30 has a top-emitting structure, and a top side of the second light emitting element 30 is away from the base substrate 10. For example, the first light emitting element 20 and the second light emitting element 30 share the same base substrate 10. The first light L1 having the first wavelength range is emitted from the top side of the first light emitting element 20. The second light L2 having the second wavelength range is emitted from the top side of the second light emitting element 30. The first light L1 is reflected into the first reflected light RL1 by the reflective lateral side 202. The second light L2 is reflected into the second reflected light RL2 by the reflective lateral side 202. The first reflected light RL1 and the second reflected light RL2 are composited into the composite light CL in the substantially transparent layer 300, and transmitted out from the substantially transparent top side 301 of the light emitting apparatus.

Optionally, the composite light CL is a light of white color. In one example, the first light having the first wavelength range is a light of first color. The second light having the second wavelength range is a light of second color. The composition of the light of first color and the light of second color is a composite light of white color. In another example, the first light having the first wavelength range is selected from a group consisting of blue light, green light, red light. The second light having the second wavelength range is selected from a group consisting of blue light, green light, red light.

In some embodiment, the light emitting apparatus is absent of any wavelength conversion layer. Optionally, the wavelength conversion layer is a layer including fluorescent materials.

In some embodiments, the light emitting apparatus has the first light emitting element 20 and the second light emitting element 30 respectively on two opposite sides of the same base substrate. Optionally, the first light emitting element 20 emits the first light L1 having the first wavelength range in the first direction D1, and the second light emitting element 30 emits the second light L2 having the second wavelength range in the second direction. The first direction D1 and the second direction D2 are different. There is no mutual interference between the first light L1 having the first wavelength range and the second light L2 having the second wavelength range. This arrangement will enhance the quantum efficiency and improve the quality of the white color, so the light emitting apparatus has advantages including a high light output efficiency and a great color rendering index. The light emitting apparatus absent of fluorescent materials avoids problems including short life of the fluorescent materials, energy loss and self-absorption during the process of exciting the fluorescent materials. So, the light emitting apparatus has a high photoelectric conversion efficiency and a high light output efficiency, which is suitable to be used as an energy-saving backlight, as well as an everyday light.

Figure 1B:
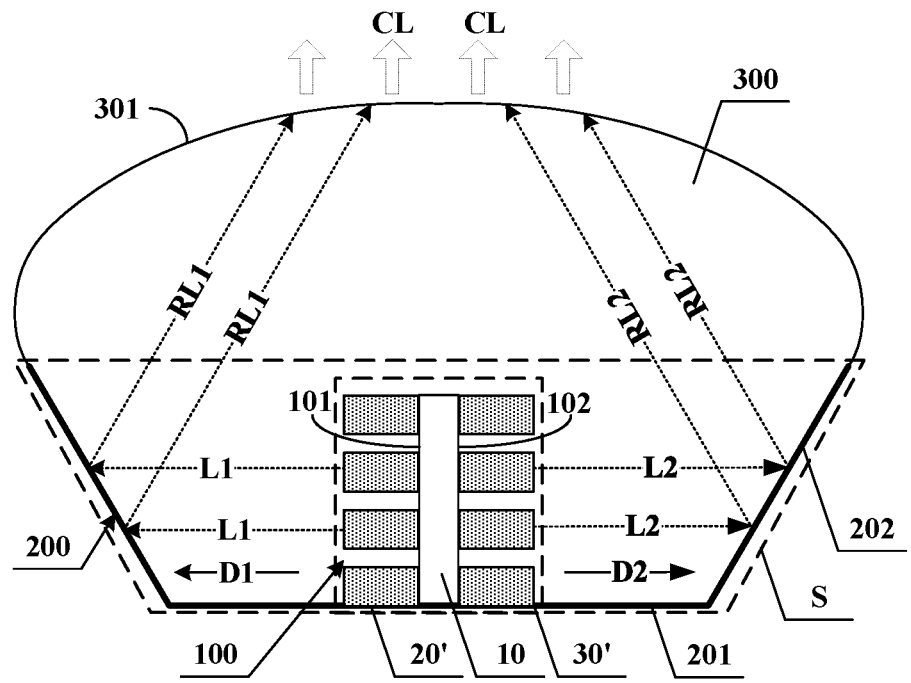
FIG. 1B is a schematic diagram of a structure of a light emitting apparatus in some embodiments according to the present disclosure.

FIG. 1B is a schematic diagram of a structure of a light emitting apparatus in some embodiments according to the present disclosure. Referring to FIG. 1B, in some embodiments, the light emitting apparatus includes a plurality of first light emitting elements 20' and a plurality of second light emitting elements 30'. Optionally, the plurality of first light emitting elements 20' and the plurality of second light emitting elements 30' are respectively on the first side 101 and a second side 102 of the base substrate 10.

Figure 2:
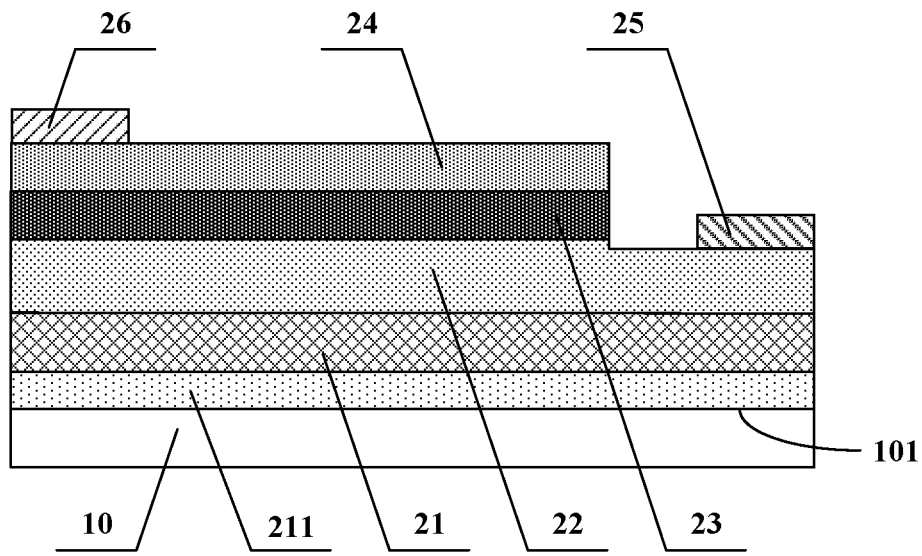
FIG. 2 is a schematic diagram of a structure of a first light emitting element in some embodiments according to the present disclosure.

FIG. 2 is a schematic diagram of a structure of a first light emitting element in some embodiments according to the present disclosure. Referring to FIG. 2, in some embodiments, the first light emitting element 20 includes a first type doped semiconductor layer 22, a first quantum-well layer 23, a second type doped semiconductor layer 24 sequentially stacked on the first side 101 of the base substrate 10.

In some embodiments, referring to FIG. 1A and FIG. 2, the first light emitting element 20 includes a first quantum-well layer 23 (e.g. a first multiple quantum wells layer) on the first side 101 of the base substrate 10 configured to emit the first light L1 having the first wavelength range toward the reflective lateral side 202 of the frame structure 200. Optionally, the first quantum-well layer 23 is a multiple quantum wells layer.

In some embodiments, the first light emitting element 20 further includes the first type doped semiconductor layer 22 on a side of the first quantum-well layer 23 closer to the base substrate 10, and the second type doped semiconductor layer 24 on a side of the first quantum-well layer 23 away from the base substrate 10.

Optionally, the second type doped semiconductor layer 24, the first quantum-well layer 23, and the first type doped semiconductor layer 22 are sequentially arranged along the direction substantially parallel to the main surface of the bottom side 201 of the frame structure 200.

In some embodiments, the first light emitting element 20 further includes a first electrode 25 on the side of the first type doped semiconductor layer 22 away from the base substrate 10; and a second electrode 26 on a side of the second type doped semiconductor layer 24 away from the base substrate 10.

Optionally, an orthographic projection of the first electrode 25 on the base substrate 10 is substantially non-overlapping with an orthographic projection of the first quantum-well layer 23 on the base substrate. Optionally, an orthographic projection of the second electrode 26 on the base substrate 10 is at least partially overlapping with the orthographic projection of the first quantum-well layer 23 on the base substrate 10.

Figure 3:
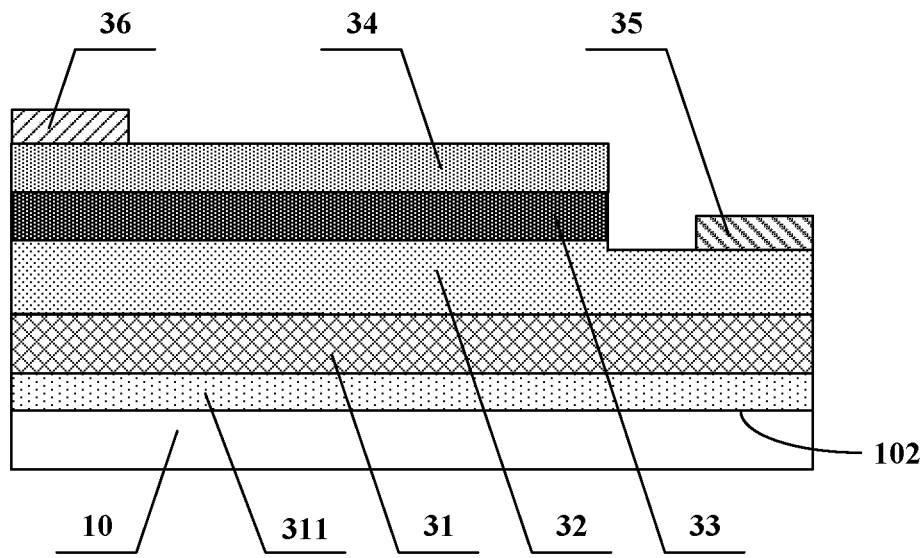
FIG. 3 is a schematic diagram of a structure of a second light emitting element in some embodiments according to the present disclosure

FIG. 3 is a schematic diagram of a structure of a second light emitting element in some embodiments according to the present disclosure. Referring to FIG. 3, in some embodiments, the second light emitting element 30 includes a third type doped semiconductor layer 32, a second quantum-well layer 33, a fourth type doped semiconductor layer 34 sequentially stacked on the second side 102 of the base substrate 10.

In some embodiments, referring to FIG. 1A and FIG. 3, the second light emitting element 30 includes a second quantum-well layer 33 (e.g., a second multiple quantum wells layer) on the second side 102 of the base substrate 10 configured to emit the second light L2 having the second wavelength range toward the reflective lateral side 202 of the frame structure 200. Optionally, the second quantum-well layer 33 is a multiple quantum wells layer.

Optionally, referring to FIG. 1A, FIG. 2, and FIG. 3, the first light L1 having the first wavelength range transmits from the first quantum-well layer 23 to the reflective lateral side 202 of the frame structure 200 without transmitting through the second quantum-well layer 33. Optionally, the second light L2 having the second wavelength range transmits from the second quantum-well layer 33 to the reflective lateral side 202 of the frame structure 200 without transmitting through the first quantum-well layer 23.

Optionally, the first quantum-well layer 23, the base substrate 10, and the second quantum-well layer 33 are sequentially arranged along the direction substantially parallel to the main surface of the bottom side 201 of the frame structure 200.

In some embodiments, referring to FIG. 3, the second light emitting element further includes third type doped semiconductor layer 32 on a side of the second quantum-well layer 33 closer to the base substrate 10; and a fourth type doped semiconductor layer 34 on a side of the second quantum-well layer 33 away from the base substrate 10.

Optionally, the fourth type doped semiconductor layer 34, the second quantum-well layer 33, and the third type doped semiconductor layer 32 are sequentially arranged along the direction substantially parallel to the main surface of the bottom side 201 of the frame structure 200.

Optionally, the second type doped semiconductor layer 24, the first quantum-well layer 23, the first type doped semiconductor layer 22, the base substrate 10, the third type doped semiconductor layer 32, the second quantum-well layer 33, and the fourth type doped semiconductor layer 34 are sequentially arranged along the direction substantially parallel to the main surface of the bottom side 201 of the frame structure 200.

In some embodiments, the second light emitting element 30 further includes a third electrode 35 on a side of the third type doped semiconductor layer 32 away from the base substrate 10; and a fourth electrode 36 on a side of the fourth type doped semiconductor layer 34 away from the base substrate 10.

Optionally, an orthographic projection of the third electrode 35 on the base substrate 10 is substantially non-overlapping with an orthographic projection of the second quantum-well layer 33 on the base substrate 10. Optionally, an orthographic projection of the fourth electrode 36 on the base substrate 10 is at least partially overlapping with the orthographic projection of the second quantum-well layer 33 on the base substrate 10.

In some embodiments, referring to FIG. 2, the light emitting apparatus further includes a first reflective layer 21 between the base substrate 10 and the first quantum-well layer 23. Optionally, the first reflective layer 21 is configured to reflect light emitted from the first quantum-well layer 23 toward the reflective lateral side 202 of the frame structure 200.

In some embodiments, referring to FIG. 3, the light emitting apparatus further includes a second reflective layer 31 between the base substrate 10 and the second quantum-well layer 33. Optionally, the second reflective layer 31 is configured to reflect light emitted from the second quantum-well layer 33 toward the reflective lateral side 202 of the frame structure 200.

Optionally, referring to FIG. 1A, FIG. 2, and FIG. 3, the first quantum-well layer 23, the first reflective layer 21, the base substrate 10, the second reflective layer 31, and the second quantum-well layer 33 are sequentially arranged along the direction substantially parallel to the main surface of the bottom side 201 of the frame structure 200.

Optionally, the second type doped semiconductor layer 24, the first quantum-well layer 23, the first type doped semiconductor layer 22, the first reflective layer 21, the base substrate 10, the second reflective layer 31, the third type doped semiconductor layer 32, the second quantum-well layer 33, and the fourth type doped semiconductor layer 34 are sequentially arranged along the direction substantially parallel to the main surface of the bottom side 201 of the frame structure 200.

Various types of reflective structures can be used to form the first reflective layer and the second reflective layer. Examples of reflective structures include, but are not limited to distributed Bragg reflectors and silver mirror structures.

In some embodiments, the first reflective layer 21 is a distributed Bragg reflector. Optionally, the second reflective layer 31 is a distributed Bragg reflector. Optionally, the distributed Bragg reflector includes a plurality of high refractive index sub-layers and a plurality of low refractive index sub layers alternatively arranged, e.g., having a HL . . . HL structure, wherein H stands for a sub-layer having a high refractive index, and L stands for a sub-layer having a low refractive index. So, the distributed Bragg reflector has a multi-layer structure, which equivalent to a group of Photonic Crystals.

Optionally, the H sub-layer includes titanium oxide and the L sub-layer includes silicon oxide. Optionally, the H sub-layer includes hafnium oxide and the L sub-layer includes silicon oxide. Optionally, the H sub-layer includes gallium nitride and the L sub-layer includes aluminum nitride. Optionally, the H sub-layer includes aluminum gallium nitride and the L sub-layer includes gallium nitride. Optionally, the H sub-layer includes aluminum gallium arsenide and the L sub-layer includes gallium arsenide.

Optionally, the distributed Bragg reflector is a quarter-wave reflector, where a thickness of a respective one of the plurality of sub-layers is relevant to one quarter of the wavelength which a light reflected by the distributed Bragg reflector has.

Optionally, a thickness of a respective one of the plurality of sub-layers of the distributed Bragg reflector can be calculated using the follow equation:

$$d=\lambda/4\eta$$

wherein d represents a thickness of a respective one of the plurality of sub-layers of the distributed Bragg reflector; $\lambda$ represents a main wavelength a light reflected by the distributed Bragg reflector has; and $\eta$ is a reflective index of the respective one of the plurality of sub-layers of the distributed Bragg reflector.

For example, a light reflected by a distributed Bragg reflector has a main wavelength 450 nm (e.g., a blue light). The distributed Bragg reflector has a plurality of H sub-layers having high refractive index, and a plurality of L sub-layers having low refractive index. A respective one of the plurality of H sub-layers includes titanium oxide, and a respective one of the plurality of L sub-layers includes silicon oxide. A refractive index of the respective one of the plurality of L sub-layers including silicon oxide is 1.47, so the thickness of the respective one of the plurality of L sub-layers is 76.5 nm. A refractive index of the respective one of the plurality of H sub-layers includes titanium oxide is 2.52, so the thickness of the respective one of the plurality of H sub-layers is 44.64 nm.

Since the electromagnetic wave whose frequency falls within the energy gap cannot transmit through the distributed Bragg reflector, the reflectivity of the distributed Bragg reflector can reach more than 99%. The distributed Bragg reflector will not have the same absorption problem as a metal mirror has. As the number of the sub-layers of the distributed Bragg reflector increases, the reflection efficiency becomes higher.

Optionally, an energy gap position can be adjusted by changing a thickness of the respective one of a plurality of sub-layers of the distributed Bragg reflector, or changing the materials of the respective one of a plurality of sub-layers of the distributed Bragg reflector.

By depositing the first reflective layer (e.g., the distributed Bragg reflector) to reflect the first light having the first wavelength range emitted from the first quantum-well layer, and depositing the second reflective layer (e.g., the distributed Bragg reflector) to reflect the second light having the second wavelength range emitted from the second quantum-well layer, interference between the first light and the second light is avoided, and the first reflective layer and the second reflective layer can prevent the base substrate from absorbing the first light and the second light to improve the light output efficiency.

In some embodiments, referring to FIG. 2 and FIG. 3, the light emitting apparatus further includes a first buffer layer 211 between the base substrate 10 and the first reflective layer 21; and a second buffer layer 311 between the base substrate 10 and the second reflective layer 31.

Optionally, the second type doped semiconductor layer 24, the first quantum-well layer 23, the first type doped semiconductor layer 22, the first reflective layer 21, the first buffer layer 211, the base substrate 10, the second buffer layer 311, the second reflective layer 31, the third type doped semiconductor layer 32, the second quantum-well layer 33, and the fourth type doped semiconductor layer 34 are sequentially arranged along the direction substantially parallel to the main surface of the bottom side 201 of the frame structure 200.

Optionally, the first buffer layer 211 can function as a sub-layer of the first reflective layer 21. Optionally, the second buffer layer 311 can function as a sub-layer of the second reflective layer 31.

Figure 4:
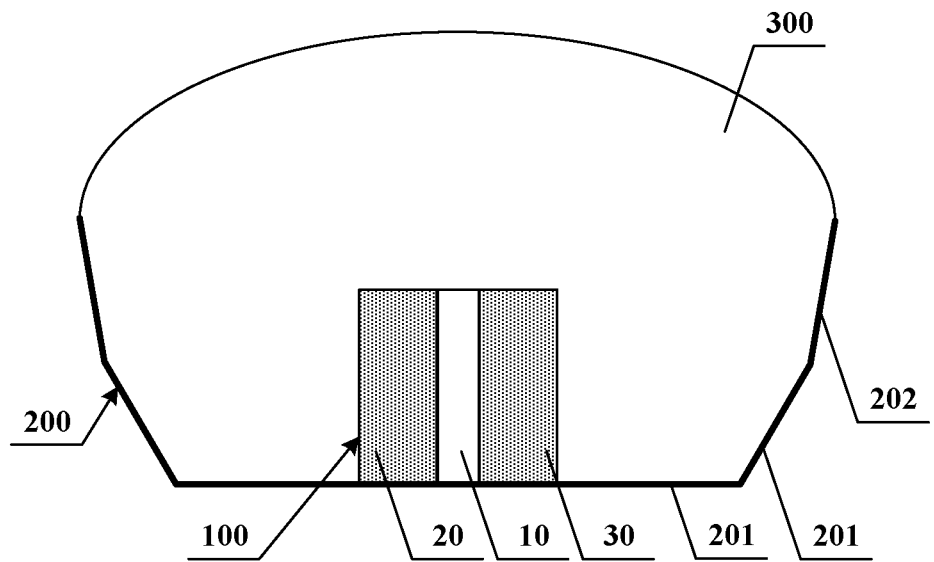
FIG. 4 is a schematic diagram of a structure of a light emitting apparatus in some embodiments according to the present disclosure.

FIG. 4 is a schematic diagram of a structure of a light emitting apparatus in some embodiments according to the present disclosure. Referring to FIG. 4, in some embodiments, the lateral side 202 of the inverted substantially trapezoidal shape of the cross section of the frame structure 200 are folded line.

Figure 5:
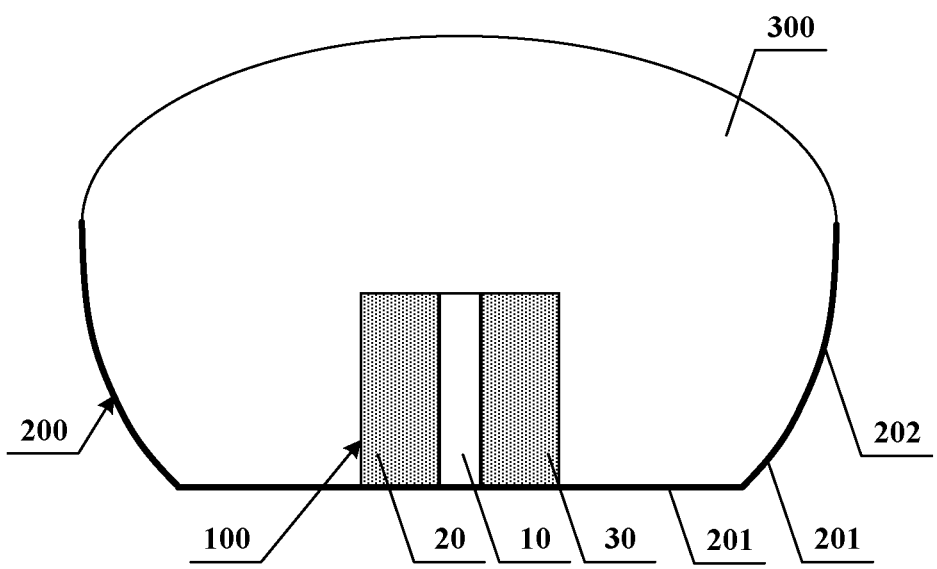
FIG. 5 is a schematic diagram of a structure of a light emitting apparatus in some embodiments according to the present disclosure.

FIG. 5 is a schematic diagram of a structure of a light emitting apparatus in some embodiments according to the present disclosure. Referring to FIG. 4, in some embodiments, the lateral side 202 of the inverted substantially trapezoidal shape of the cross section of the frame structure 200 are curved line.

By changing the shape of the frame structure 200, the first reflected light RL2 and the second reflected light RL2 reflected by the lateral side 202 of the frame structure 200, the composite light including a first component of the first wavelength range and a second component of the second wavelength range may have a better quality. Optionally, when the composite light is a converged light the size of the substantially transparent top side 301 can be reduced.

Referring to FIG. 1, in some embodiments, a cross-section of the base substrate 10 along a plane substantially perpendicular to the bottom side 201 of the base substrate 10 and substantially parallel to the first direction D1 is a substantial rectangular shape. Optionally, the first side of the base substrate 10 and the second side of the base substrate 10 are substantially parallel to each other.

As used herein, the term "substantially rectangular" refers to a polygonal shape (e.g., a parallelogram) in which the opposing sides are substantially parallel, and the corner angles are substantially 90 degrees. Optionally, the corner angles of the substantially rectangular shape is in a range of approximately 75 degrees to approximately 105 degrees, e.g., approximately 89 degrees to approximately 91 degrees, approximately 88 degrees to approximately 92 degrees, approximately 85 degrees to approximately 95 degrees, approximately 80 degrees to approximately 100 degrees, or approximately 90 degrees.

Figure 6:
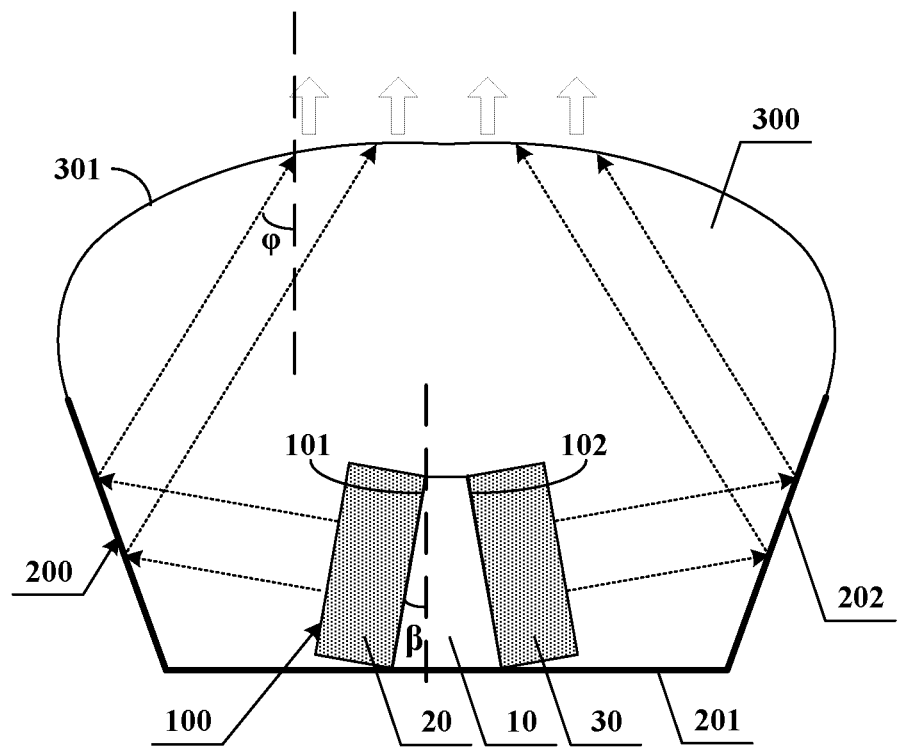
FIG. 6 is a schematic diagram of a structure of a light emitting apparatus in some embodiments according to the present disclosure.

FIG. 6 is a schematic diagram of a structure of a light emitting apparatus in some embodiments according to the present disclosure. Referring to FIG. 1 and FIG. 6, in some embodiments, the cross-section of the base substrate 10 along a plane substantially perpendicular to the bottom side 201 of the base substrate 10 and substantially parallel to the first direction D1 is a substantially trapezoidal shape. Optionally, the cross-section of the base substrate 10 along a plane substantially perpendicular to the bottom side 201 of the base substrate 10 and substantially parallel to the first direction D1 is a substantially inverted trapezoidal shape.

Optionally, an acute angle $\beta$ is between the first side 101 of the base substrate 10 and a direction perpendicular to the bottom side 201 of the frame structure 200. For example, as the acute angle $\beta$ increases, the acute angle $\varphi$ decreases, the composite light is a more converged light, so, an area of the substantially transparent top side 301 can be smaller for the composite light to transmit out of the light emitting apparatus. Optionally, the acute angle $\beta$ is in a range of approximately 5° to approximately 45°, e.g. approximately 5° to approximately 15°, approximately 15° to approximately 25°, approximately 25° to approximately 35°, approximately 35° to approximately 45°.

Figure 7A:
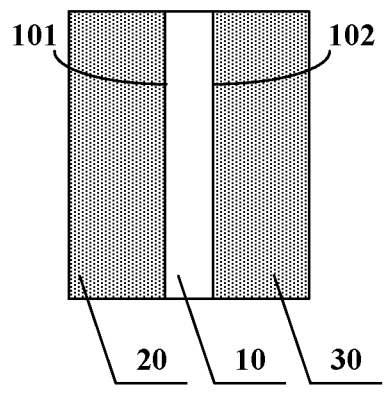
FIG. 7A is a plan view of a structure of a first light emitting element, a second light emitting element, and a base substrate in some embodiments according to the present disclosure.

FIG. 7A is a plan view of a structure of a first light emitting element, a second light emitting element, and a base substrate in some embodiments according to the present disclosure. Referring to FIG. 1 and FIG. 7A, in some embodiments, an orthographic projection of the base substrate 10 on the bottom side 201 of the frame structure 200 has a substantial rectangular shape. Optionally, the first side 101 and the second side 102 are two opposite sides of the base substrate 10 substantially parallel to each other.

Figure 7B:
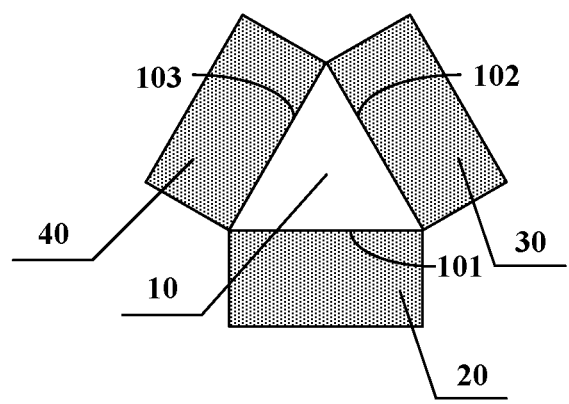
FIG. 7B is a plan view of a structure of a first light emitting element, a second light emitting element, a third light emitting element, and a base substrate in some embodiments according to the present disclosure.

FIG. 7B is a plan view of a structure of a first light emitting element, a second light emitting element, a third light emitting element, and a base substrate in some embodiments according to the present disclosure. Referring to FIG. 7B, in some embodiments, an orthographic projection of the base substrate 10 on the bottom side 201 of the frame structure 200 has a substantial triangular shape.

As used herein, the term "substantial triangular shape" can include shapes or geometries having three sides extending along different directions (regardless of whether the three sides include straight lines, curved lines or otherwise).

Optionally, the base substrate 10 has a first side 101, a second side 102, and a third side 103. For example, one of two lateral sides of the first side 101 is connected to the third side 103, another one of the two lateral sides of the first side 101 is connected to the second side 102. One of two lateral sides of the second side 102 is connected to the first side 101, another one of the two lateral sides of the second side 102 is connected to the third side 103. One of two lateral sides of the third side 103 is connected to the second side 102, another one of the two lateral sides of the third side 103 is connected to the first side 101.

Optionally, a first light emitting elements is formed on the first side 101 of the base substrate 10. Optionally, a second light emitting elements is formed on the second side 102 of the base substrate 10. Optionally, a third light emitting elements is formed on the third side 103 of the base substrate 10.

In another aspect, the present disclosure provides a method of fabricating a light emitting apparatus. In some embodiments, the method of fabricating the light emitting apparatus includes forming a frame structure having a bottom side and a reflective lateral side connecting to the bottom side; forming a first light emitting element and a second light emitting element on the bottom side of the frame structure. Optionally, the first light emitting element is formed to emit a first light having a first wavelength range along a first direction substantially parallel to a main surface of the bottom side of the frame structure. Optionally, the second light emitting element is formed to emit a second light having a second wavelength range along a second direction substantially parallel to the main surface of the bottom side of the frame structure. Optionally, the first direction and the second direction are substantially opposite to each other. Optionally, the reflective lateral side of the frame structure is formed to reflect the first light having the first wavelength range into a first reflected light and reflect the second light having the second wavelength range into a second reflected light. Optionally, the first reflected light and the second reflected light transmit out of a substantially transparent top side of the light emitting apparatus in form of a composite light including a first component of the first wavelength range and a second component of the second wavelength range. Optionally, the substantially transparent top side is opposite to the bottom side.

In one example, the method of fabricating the light emitting apparatus includes providing a growth substrate; forming a first reflective layer on a first side of the growth substrate; forming a first type doped semiconductor layer on a side of the first reflective layer away from the growth substrate; forming a first quantum-well layer on a side of the first type doped semiconductor layer away from the growth substrate; forming a second type doped semiconductor layer on a side of the first quantum-well layer away from the growth substrate; forming a second reflective layer on a second side of the growth substrate. Optionally, the first side and the second side are two substantially opposite sides of the growth substrate. Optionally, the method of fabricating the light emitting apparatus further includes forming a third type doped semiconductor layer on a side of the second reflective layer away from the growth substrate; forming a second quantum-well layer on a side of the third type doped semiconductor layer away from the growth substrate; forming a fourth type doped semiconductor layer on a side of the second quantum-well layer away from the growth substrate. Optionally, the second type doped semiconductor layer, the first quantum-well layer, the first type doped semiconductor layer, the first reflective layer, the base substrate, the second reflective layer, the third type doped semiconductor layer, the second quantum-well layer, and the fourth type doped semiconductor layer are sequentially arranged along the direction substantially parallel to the main surface of the bottom side.

Figure 8:
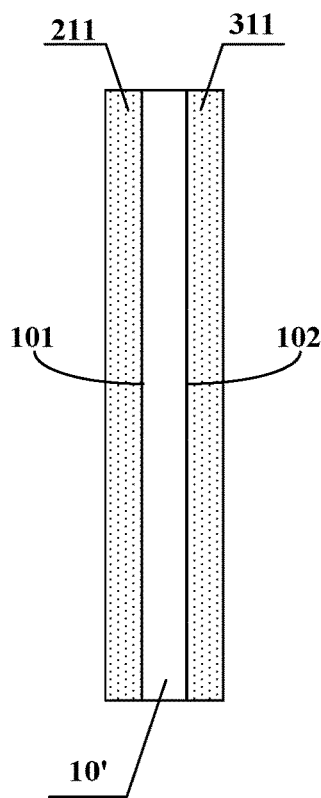
FIG. 8 is a schematic diagram illustrating forming a first buffer layer and a second buffer layer in some embodiments according to the present disclosure.

FIG. 8 is a schematic diagram illustrating forming a first buffer layer and a second buffer layer in some embodiments according to the present disclosure. Referring to FIG. 8, the method of fabricating the light emitting apparatus includes forming a growth substrate (e.g., the base substrate) 10' having the first side and the second side. Optionally, the first side and the second side are two substantially opposite sides of the growth substrate 10'.

Optionally, the method further includes forming a first buffer layer 211 on the first side 101 of the growth substrate 10' using a metal organic chemical vapor deposition; and forming a second buffer layer 311 on the second side 102 of the growth substrate 10' using the metal organic chemical vapor deposition.

Various materials may be used for making the growth substrate 10'. Examples of materials suitable for making the growth substrate 10' include, but are not limited to, sapphire (e.g. aluminum oxide ($Al_2O_3$)), silicon carbide (SiC), silicon (Si), and gallium arsenide (GaAs).

Various materials may be used for making the first buffer layer 211 and the second buffer layer 311. Examples of materials suitable for making the first buffer layer 211 and the second buffer layer 311 include, but are limited to, gallium nitride (GaN).

Optionally, the first buffer layer 211 and the second buffer layer 311 have a same material. Optionally, the first buffer layer 211 and the second buffer layer 311 can be formed on two substantially opposite side of the same growth substrate 10' in a same step.

Figure 9:
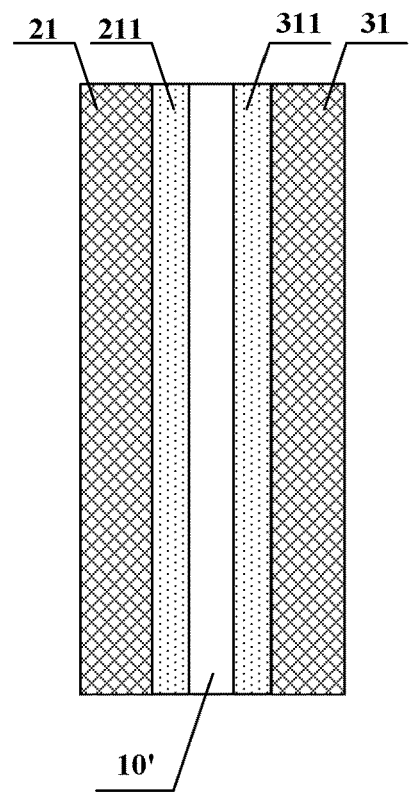
FIG. 9 is a schematic diagram illustrating forming a first reflective layer and second reflective layer in some embodiments according to the present disclosure.

FIG. 9 is a schematic diagram illustrating forming a first reflective layer and second reflective layer in some embodiments according to the present disclosure. Referring to FIG. 9, in some embodiments, the method of fabricating the light emitting apparatus further includes forming a first reflective layer 21 on a side of first buffer layer 211 away from the growth substrate 10' using the metal organic chemical vapor deposition; forming a second reflective layer 31 on a side of the second buffer layer 311 away from the growth substrate 10' using the metal organic chemical vapor deposition.

Optionally, the first buffer layer 211 can function as a sublayer of the first reflective layer 21. Optionally, the second buffer layer 311 can function as a sublayer of the second reflective layer 31.

Optionally, the first reflective layer 21 is a distributed Bragg reflector. Optionally, the second reflective layer 31 is a distributed Bragg reflector. Optionally, the distributed Bragg reflector includes a plurality of high refractive index sub-layers and a plurality of low refractive index sub layers alternatively arranged, e.g., having a HL . . . HL structure, wherein H stands for a sub-layer having a high refractive index, and L stands for a sub-layer having a low refractive index. So, the distributed Bragg reflector has a multi-layer structure, which equivalent to a group of Photonic Crystals.

Optionally, the H sub-layer includes titanium oxide and the L sub-layer includes silicon oxide. Optionally, the H sub-layer includes hafnium oxide and the L sub-layer includes silicon oxide. Optionally, the H sub-layer includes gallium nitride and the L sub-layer includes aluminum nitride. Optionally, the H sub-layer includes aluminum gallium nitride and the L sub-layer includes gallium nitride. Optionally, the H sub-layer includes aluminum gallium arsenide and the L sub-layer includes gallium arsenide.

For example, the H sub-layer includes GaN, and the L sub-layer includes AlGaN. by adjusting x of the Al(x)Ga(1−x)N, the refractive index of the L sub-layer including AlGaN is changed, and the thickness of the L sub-layer including AlGaN is also changed, therefore, the distributed Bragg reflector can reflective light having different wavelength range based on the different refractive index of the H sub-layer, the refractive index of the L sub-layer, and the thicknesses of the H sub-layer and the L sub-layer.

Optionally, the first reflective layer 21 is configured to reflect a first light having a first wavelength range. Optionally, the second reflective layer 31 is configured to reflect a second light having a second wavelength range.

Optionally, the first reflective layer 21 and the second reflective layer 31 includes different materials. Optionally, the first reflective layer 21 and the second reflective layer 31 are formed on two substantially opposite side of the growth substrate 10' in different steps.

Optionally, the first reflective layer 21 and the second reflective layer 31 are formed in on two substantially opposite side of the growth substrate 10' in a same step at the same time. For example, a deposition chamber can be divided into two independent sub-chambers using a board. An opening is formed on the board to accommodate the growth substrate 10', so the two opposite sides of the growth substrate 10' is respectively exposed in the two independent sub-chambers. Different materials are respectively deposited in different independent sub-chambers to respectively form the first reflective layer 21 and the second reflective layer 31.

Figure 10:
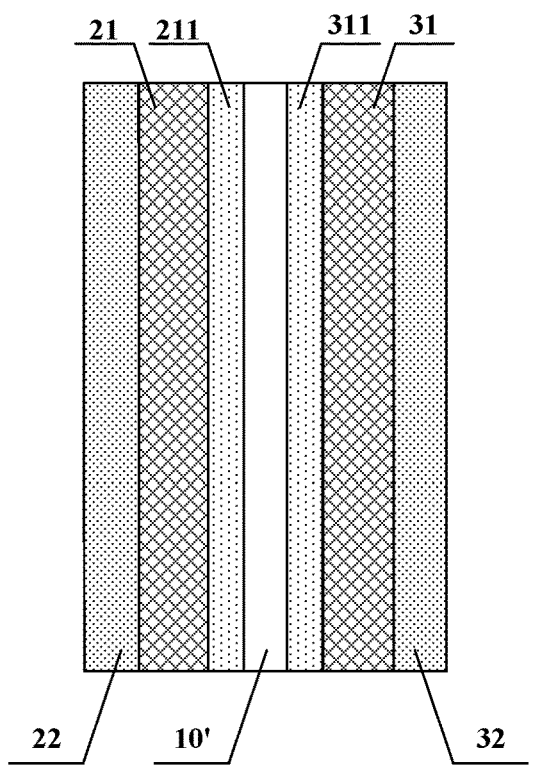
FIG. 10 is a schematic diagram illustrating forming a first type doped semiconductor layer and a third type doped semiconductor layer in some embodiments according to the present disclosure.

FIG. 10 is a schematic diagram illustrating forming a first type doped semiconductor layer and a third type doped semiconductor layer in some embodiments according to the present disclosure. Referring to FIG. 10, in some embodiments, the method of fabricating the light emitting apparatus includes forming a first type doped semiconductor layer 22 on a side of the first reflective layer 21 away from the growth substrate 10'; and forming a third type doped semiconductor layer 32 on a side of the second reflective layer 31 away from the growth substrate 10.

Various materials may be used for making the first type doped semiconductor layer 22 and the third type doped semiconductor layer 32. Examples of materials suitable for making the first type doped semiconductor layer 22 and the third type doped semiconductor layer 32 include, but are not limited to, silicon-doped gallium nitride, silicon-doped aluminum nitride, and silicon-doped aluminum-alloy gallium nitride.

Optionally, the first type doped semiconductor layer 22 and the third type doped semiconductor layer 32 include a same material. Optionally, the first type doped semiconductor layer 22 and the third type doped semiconductor layer 32 are formed on two substantially opposite sides of the growth substrate 10' in a same step.

Figure 11:
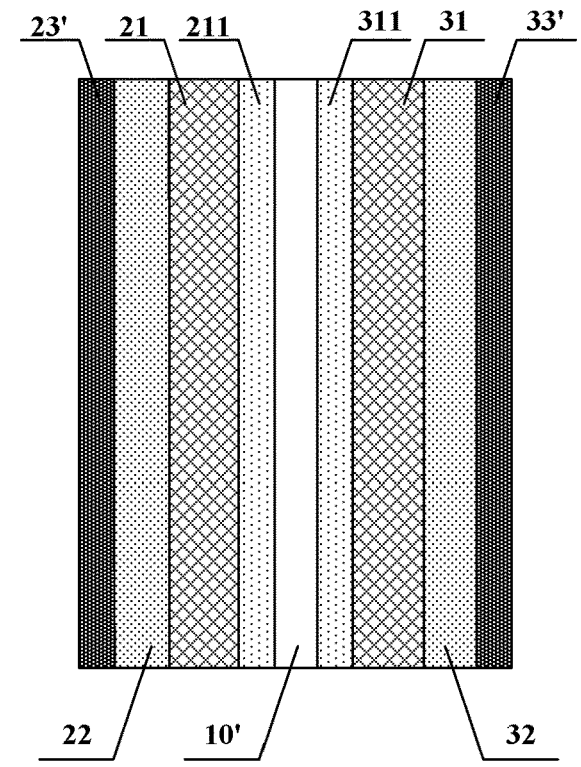
FIG. 11 is a schematic diagram illustrating forming a first quantum-well material layer and a second quantum-well material layer in some embodiments according to the present disclosure.

FIG. 11 is a schematic diagram illustrating forming a first quantum-well material layer and a second quantum-well material layer in some embodiments according to the present disclosure. Referring to FIG. 11, in some embodiments, the method of fabricating the light emitting apparatus further includes forming a first quantum-well material layer 23' on a side of the first type doped semiconductor layer 22 away from the growth substrate 10'; and forming a second quantum-well material layer 33' on a side of the third type doped semiconductor layer 32 away from the growth substrate 10'.

Optionally, the first quantum-well material layer 23' is a multiple quantum wells layer. For example, the multiple quantum wells layer ranges from one quantum well layer to ten quantum wells layer. Optionally, the second quantum-well material layer 33' is a multiple quantum wells layer. For example, the multiple quantum wells layer ranges from one quantum well layer to ten quantum wells layer.

In one example, the first quantum-well material layer 23' is formed by alternately forming InGaN sub-layers and GaN sub-layers. The second quantum-well material layer 33' is formed by alternately forming InGaN sub-layers and GaN sub-layers. In another example, the first quantum-well material layer 23' is formed by alternately forming AlGaN sub-layers and GaN sub-layers. The second quantum-well material layer 33' is formed by alternately forming AlGaN sub-layers and GaN sub-layers.

Optionally, the first quantum-well material layer 23' emits the first light having the first wavelength range. The second quantum-well material layer 33' emits the second light having the second wavelength range. By designing a different composition of a material in a quantum-well layer, the quantum-well layer can emit light with different wavelength range.

Group III nitrides have excellent properties such as material band-free bandwidth, small dielectric constant, high breakdown voltage, and good physical and chemical stability. They are widely used in high-efficiency optoelectronic devices, especially for LEDs emitting UV light, blue light, and green light.

LEDs having an InGaN/GaN quantum well structure have a high quantum efficiency. A forbidden band width of the GaN material is Eg=3.45 eV, a forbidden band width of InN is 1.95 eV. By adjusting x of the $In_xGa(1-x)N$, a mixed crystal luminescent material with a forbidden band width varying from 1.95 eV to 3.4 eV can be obtained. The wavelength ranges of light emitted by the mixed crystal luminescent material is from 365 nm to 636 nm, which covers an entire wavelength range of visible light.

For example, to obtain a composite light including a first component of the first wavelength range and a second component of the second wavelength range, the first quantum-well material layer 23' includes $In_{0.2}Ga_{0.8}N/GaN$ to emit blue light, the second quantum-well material layer 33' includes $In_{0.54}Ga_{0.46}N/GaN$ to emit light which combine with the blue light to become a white light.

Optionally, the first quantum-well material layer 23' and the second quantum-well material layer 33' include different materials. Optionally, the first quantum-well material layer 23' and the second quantum-well material layer 33' are form in two different steps.

Optionally, the first quantum-well material layer 23' and the second quantum-well material layer 33' can be formed in a one step at the same time by having a deposition chamber having two independent sub-chambers described herein.

Figure 12:
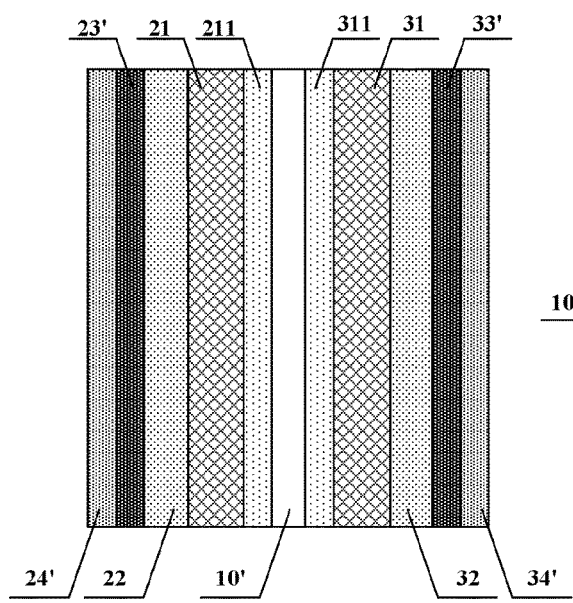
FIG. 12 is a schematic diagram illustrating forming a second type doped semiconductor material layer and a fourth type doped semiconductor material layer in some embodiments according to the present disclosure.

FIG. 12 is a schematic diagram illustrating forming a second type doped semiconductor material layer and a fourth type doped semiconductor material layer in some embodiments according to the present disclosure. Referring to FIG. 12, in some embodiments, the method of fabricating the light emitting apparatus includes forming a second type doped semiconductor material layer 24' on a side of the first quantum-well material layer 23' away from the growth substrate 10'; and forming a fourth type doped semiconductor material layer 34' on a side of the second quantum-well material layer 33' away from the growth substrate 10'.

Various appropriate materials may be used for making the second type doped semiconductor material layer 24' and the fourth type doped semiconductor material layer 34'. Examples of materials used by the second type doped semiconductor material layer 24' and the fourth type doped semiconductor material layer 34' include, but are not limited to, magnesium doped gallium nitride, magnesium doped aluminum nitride, and magnesium doped aluminum gallium nitride.

Optionally, the second type doped semiconductor material layer 24' and the fourth type doped semiconductor material layer 34' have a same material. Optionally, the second type doped semiconductor material layer 24' and the fourth type doped semiconductor material layer 34' are formed in a same step.

Figure 13:
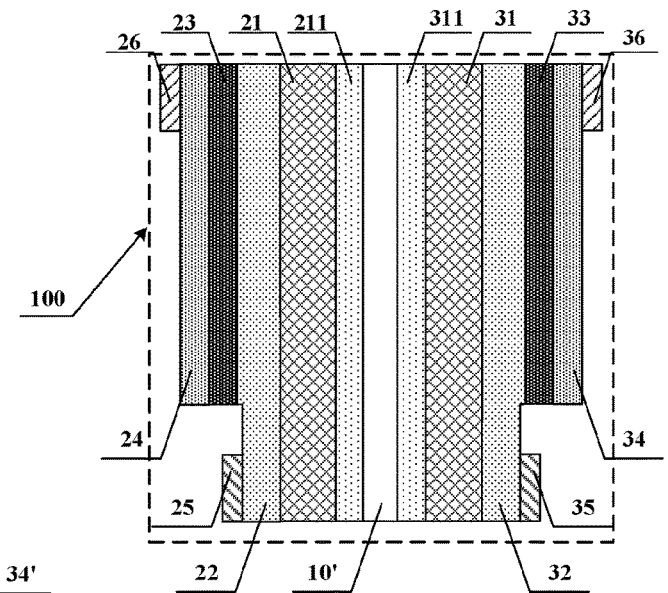
FIG. 13 is a schematic diagram illustrating forming a first light emitting element and a second light emitting element on two opposite sides of a base substrate in some embodiments according to the present disclosure.

FIG. 13 is a schematic diagram illustrating forming a first light emitting element and a second light emitting element on two opposite sides of a base substrate in some embodiments according to the present disclosure. Referring to FIG. 12 and FIG. 13, in some embodiments, the first quantum-well material layer 23' and the second type doped semiconductor layer 24' are etched using Inductively Coupled Plasma or Reaction Ion Etching to form the first quantum-well layer 23 and the second type doped semiconductor layer 24. The first quantum-well material layer 23' is etched to partially expose a surface of the first type doped semiconductor layer 22. Optionally, a first groove is formed on the first type doped semiconductor layer 22

Optionally, the second quantum-well material layer 33' and the fourth type doped semiconductor material layer 34' are etched using Inductively Coupled Plasma or Reaction Ion Etching to form the second quantum-well layer 33 and the fourth type doped semiconductor layer 34. The second quantum-well material layer 33' is etched to partially expose a surface of the third type doped semiconductor layer 32. Optionally, a second groove is formed on the third type doped semiconductor layer 32.

Optionally, the method of fabricating the light emitting apparatus further includes forming a first electrode 25 on a side of the first type doped semiconductor layer 22 by evaporating. For example, the first electrode 25 is formed on the exposed surface of the first type doped semiconductor layer 22.

Optionally, the method of fabricating the light emitting apparatus further includes forming a third electrode 35 on a side of the third type doped semiconductor layer 32 by evaporating. For example, the third electrode 35 is formed on the exposed surface of the third type doped semiconductor layer 32.

Optionally, the method of fabricating the light emitting apparatus further includes forming a second electrode 26 on a side of the second type doped semiconductor layer 24 away from the growth substrate 10' by evaporating; and forming a fourth electrode 36 on a side of the fourth type doped semiconductor layer 34 away from the growth substrate 10' by evaporating, to forming a light emitting structure 100.

Various appropriate materials may be used for making the first electrode 25 and the third electrode 35. Examples of materials suitable for making the first electrode 25 and the third electrode 35 include, but are not limited to, titanium-aluminum alloy (Ti/Al) and titanium-aluminum-titanium-gold alloy (Ti/AlTi/Au)

Various appropriate materials may be used for making the second electrode 26 and the fourth electrode 36. Examples of materials suitable for making the second electrode 26 and the fourth electrode 36 include, but are not limited to, nickel-gold alloy (Ni/Au) and titanium-gold alloy (Ti/Au).

Optionally, because the first type doped semiconductor layer 22 and the third type doped semiconductor layer 32 have the same materials, the etching the first quantum-well material layer 23' and the second type doped semiconductor layer 24' and etching the second quantum-well material layer 33' and the fourth type doped semiconductor material layer 34' can be finished in a same step.

Optionally, the first electrode 25 and the third electrode 35 include a same material. Optionally, the first electrode 25 and the third electrode 35 are formed in a same step.

Optionally, the second electrode 26 and the fourth electrode 36 include a same material. Optionally, the second electrode 26 and the fourth electrode 36 are formed in a same step.

Referring to FIG. 1 and FIG. 13, in some embodiments, the light emitting structure 100 formed in FIG. 13 is disposed on a bottom side 201 of a frame structure 200. The first side 101 and the second side 102 of the base substrate 10 (growth substrate 10') is substantially perpendicular to a main surface of the bottom side 201 of the frame structure 200.

Optionally, the second type doped semiconductor layer 24, the first quantum-well layer 23, the first type doped semiconductor layer 22, the first reflective layer 21, the base substrate 10 (growth substrate 10'), the second reflective layer 31, the third type doped semiconductor layer 32, the second quantum-well layer 33, and the fourth type doped semiconductor layer 34 are sequentially arranged along the direction substantially parallel to the main surface of the bottom side 201.

Optionally, the first quantum-well layer emits a first light having a first wavelength range in a first direction toward a reflective lateral side 202 of the frame structure 200. Optionally, the second quantum-well layer emits a second light having a second wavelength range in a second direction toward the reflective lateral side 202 of the frame structure 200. Optionally, the first direction and the second direction are substantially opposite.

In some embodiments, the method of fabricating the light emitting apparatus includes forming a substantially transparent layer 300 having a substantially transparent top side 301 in the space S defined by the frame structure 200. Optionally, the substantially transparent layer 300 and the frame structure 200 together constitute a cupcake shape. Optionally, the substantially transparent top side 301 is formed using mold or nano printing.

Various appropriate materials may be used for making the substantially transparent layer 300. Examples of materials suitable for making the substantially transparent layer 300 include, but are not limited to, acrylic or epoxy.

Various appropriate methods may be used for making the reflective lateral side 202 of the frame structure 200. Examples of methods suitable for making the reflective lateral side 202 of the frame structure 200 include, but are not limited to, plating silver and plating aluminum.

In some embodiments, the method of fabricating the light emitting apparatus further includes a protection layer covering the first electrode 25, the second electrode 26, the third electrode 35, and the fourth electrode 36. Optionally, the protection layer can be paraffin or photoresist.

The process of forming the light emitting structure having the first light emitting element and the second light emitting elements is similar to a process of forming a single light emitting elements, so it is not necessary to have a new equipment, or a special process.

In another aspect, the present disclosure further provides a method of emitting light using a light emitting apparatus. In some embodiments, the method of emitting light using the light emitting apparatus includes emitting a first light having a first wavelength range along a first direction substantially parallel to a main surface of a bottom side of a frame structure using a first light emitting element on the bottom side of the frame structure; emitting a second light having a second wavelength range along a second direction substantially parallel to the main surface of the bottom side of the frame structure using a second light emitting element on the bottom side of the frame structure; reflecting the first light having the first wavelength range into a first reflected light and reflect the second light having the second wavelength range into a second reflected light using a reflective lateral side of the frame structure; and transmitting the first reflected light and the second reflected light out of a substantially transparent top side of the light emitting apparatus in form of a composite light including a first component of the first wavelength range and a second component of the second wavelength range.

Optionally, the first direction and the second direction are substantially opposite to each other. Optionally, the reflective lateral side of the frame structure is connected to the bottom side of the frame structure. Optionally, the substantially transparent top side of the light emitting apparatus is opposite to the bottom side of the frame structure.

Optionally, the first light emitting element includes the first quantum-well layer on the first side of the base substrate; and the second light emitting element includes a second quantum-well layer on the second side of the base substrate.

Optionally, the method of emitting light using the light emitting apparatus further includes emitting the first light having the first wavelength range toward the reflective lateral side of the frame structure using the first quantum-well layer; and emitting the second light having the second wavelength range toward the reflective lateral side of the frame structure using the second quantum-well layer.

Optionally, the first light having the first wavelength range transmits from the first quantum-well layer to the reflective lateral side without transmitting through the second quantum-well layer. Optionally, the second light having the second wavelength range transmits from the second quantum-well layer to the reflective lateral side without transmitting through the first quantum-well layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting apparatus, comprising:
a frame structure having a bottom side and a reflective lateral side connecting to the bottom side; and
a first light emitting element and a second light emitting element on the bottom side of the frame structure;
wherein the first light emitting element is configured to emit a first light having a first wavelength range along a first direction substantially parallel to a main surface of the bottom side of the frame structure;
the second light emitting element is configured to emit a second light having a second wavelength range along a second direction substantially parallel to the main surface of the bottom side of the frame structure, wherein the first direction and the second direction are substantially opposite to each other; and
the reflective lateral side of the frame structure is configured to reflect the first light having the first wavelength range into a first reflected light and reflect the second light having the second wavelength range into a second reflected light, wherein the first reflected light and the second reflected light transmit out of a substantially transparent top side of the light emitting apparatus in form of a composite light comprising a first component of the first wavelength range and a second component of the second wavelength range, wherein the substantially transparent top side is opposite to the bottom side;
wherein the light emitting apparatus further comprises a base substrate between the first light emitting element and the second light emitting element;
wherein the first light emitting element, the base substrate, and the second light emitting element are sequentially arranged along a direction substantially parallel to the main surface of the bottom side;
the first light emitting element and the second light emitting element are respectively on a first side and a second side of the base substrate, wherein the first side and the second side are two substantially opposite sides of the base substrate, and the first side and the second side are respectively substantially perpendicular to the main surface of the bottom side; and
orthographic projections of the first light emitting element and the second light emitting element on a plane containing the first side of the base substrate are substantially non-overlapping with an orthographic projection of the bottom side on the plane containing the first side of the base substrate;
wherein the first light emitting element comprises a first quantum-well layer on the first side of the base substrate configured to emit the first light having the first wavelength range toward the reflective lateral side of the frame structure;
the second light emitting element comprises a second quantum-well layer on the second side of the base substrate configured to emit the second light having the second wavelength range toward the reflective lateral side of the frame structure;
the first light having the first wavelength range transmits from the first quantum-well layer to the reflective lateral side without transmitting through the second quantum-well layer;
the second light having the second wavelength range transmits from the second quantum-well layer to the reflective lateral side without transmitting through the first quantum-well layer; and
the first quantum-well layer, the base substrate, and the second quantum-well layer are sequentially arranged along a direction substantially parallel to the main surface of the bottom side;

wherein the light emitting apparatus further comprises:
a first reflective layer between the base substrate and the first quantum-well layer, and configured to reflect light emitted from the first quantum-well layer toward the reflective lateral side of the frame structure; and
a second reflective layer between the base substrate and the second quantum-well layer, and configured to reflect light emitted from the second quantum-well layer toward the reflective lateral side of the frame structure;
wherein the first quantum-well layer, the first reflective layer, the base substrate, the second reflective layer, and the second quantum-well layer are sequentially arranged along the direction substantially parallel to the main surface of the bottom side.

2. The light emitting apparatus of claim 1, wherein the base substrate is a growth substrate for epitaxial growth of layers of the first light emitting element and layers of the second light emitting element.

3. The light emitting apparatus of claim 1, wherein the first reflective layer is a distributed Bragg reflector; and
the second reflective layer is a distributed Bragg reflector.

4. The light emitting apparatus of claim 1, wherein the first light emitting element further comprises:
a first type doped semiconductor layer on a side of the first quantum-well layer closer to the base substrate; and
a second type doped semiconductor layer on a side of the first quantum-well layer away from the base substrate;
wherein the second light emitting element further comprises:
a third type doped semiconductor layer on a side of the second quantum-well layer closer to the base substrate; and
a fourth type doped semiconductor layer on a side of the second quantum-well layer away from the base substrate;
wherein the second type doped semiconductor layer, the first quantum-well layer, the first type doped semiconductor layer, the first reflective layer, the base substrate, the second reflective layer, the third type doped semiconductor layer, the second quantum-well layer, and the fourth type doped semiconductor layer are sequentially arranged along the direction substantially parallel to the main surface of the bottom side.

5. The light emitting apparatus of claim 4, wherein the first light emitting element further comprises a first electrode on a side of the first type doped semiconductor layer away from the base substrate; and
a second electrode on a side of the second type doped semiconductor layer away from the base substrate;
wherein an orthographic projection of the first electrode on the base substrate is substantially non-overlapping with an orthographic projection of the first quantum-well layer on the base substrate; and
an orthographic projection of the second electrode on the base substrate at least partially overlaps with the orthographic projection of the first quantum-well layer on the base substrate.

6. The light emitting apparatus of claim 4, wherein the second light emitting element further comprises a third electrode on a side of the third type doped semiconductor layer away from the base substrate; and
a fourth electrode on a side of the fourth type doped semiconductor layer away from the base substrate;
wherein an orthographic projection of the third electrode on the base substrate is substantially non-overlapping with an orthographic projection of the second quantum-well layer on the base substrate; and
an orthographic projection of the fourth electrode on the base substrate at least partially overlaps with the orthographic projection of the second quantum-well layer on the base substrate.

7. The light emitting apparatus of claim 1, wherein the composite light is a light of white color.

8. The light emitting apparatus of claim 1, further comprising:
a first buffer layer between the base substrate and the first reflective layer; and
a second buffer layer between the base substrate and the second reflective layer.

9. The light emitting apparatus of claim 1, wherein a vertical cross-section of the frame structure along a plane perpendicular to the bottom side of the frame structure and containing a geometric center of the bottom side has a substantially inverted trapezoidal shape having an opening on a side away from the bottom side.

10. The light emitting apparatus of claim 9, wherein the lateral side of the substantially inverted trapezoidal shape are curved lines.

11. The light emitting apparatus of claim 1, wherein the light emitting apparatus is absent of any wavelength conversion layer.

12. The light emitting apparatus of claim 1, wherein the substantially transparent top side of the light emitting apparatus has an arch shape protruding along a direction opposite to the bottom side of the frame structure.

13. The light emitting apparatus of claim 1, wherein the bottom side of the frame structure has a rectangular shape or a trapezoidal shape.

14. A method of fabricating a light emitting apparatus, comprising:
forming a frame structure having a bottom side and a reflective lateral side connecting to the bottom side;
forming a first light emitting element and a second light emitting element on the bottom side of the frame structure;
wherein the first light emitting element is formed to emit a first light having a first wavelength range along a first direction substantially parallel to a main surface of the bottom side of the frame structure;
the second light emitting element is formed to emit a second light having a second wavelength range along a second direction substantially parallel to the main surface of the bottom side of the frame structure, wherein the first direction and the second direction are substantially opposite to each other; and
the reflective lateral side of the frame structure is formed to reflect the first light having the first wavelength range into a first reflected light and reflect the second light having the second wavelength range into a second reflected light, wherein the first reflected light and the second reflected light transmit out of a substantially transparent top side of the light emitting apparatus in form of a composite light comprising a first component of the first wavelength range and a second component of the second wavelength range, wherein the substantially transparent top side is opposite to the bottom side;
wherein forming the first light emitting element and the second light emitting element on the bottom side of the frame structure comprises:

providing a growth substrate;

forming a first reflective layer on a first side of the growth substrate;

forming a first type doped semiconductor layer on a side of the first reflective layer away from the growth substrate;

forming a first quantum-well layer on a side of the first type doped semiconductor layer away from the growth substrate;

forming a second type doped semiconductor layer on a side of the first quantum-well layer away from the growth substrate;

forming a second reflective layer on a second side of the growth substrate, the first side and the second side are two substantially opposite sides of the growth substrate;

forming a third type doped semiconductor layer on a side of the second reflective layer away from the growth substrate;

forming a second quantum-well layer on a side of the third type doped semiconductor layer away from the growth substrate; and forming a fourth type doped semiconductor layer on a side of the second quantum-well layer away from the growth substrate;

wherein the second type doped semiconductor layer, the first quantum-well layer, the first type doped semiconductor layer, the first reflective layer, the base substrate, the second reflective layer, the third type doped semiconductor layer, the second quantum-well layer, and the fourth type doped semiconductor layer are sequentially arranged along the direction substantially parallel to the main surface of the bottom side.

* * * * *